US007346755B2

(12) United States Patent
Pomaranski et al.

(10) Patent No.: US 7,346,755 B2
(45) Date of Patent: Mar. 18, 2008

(54) MEMORY QUALITY ASSURANCE

(75) Inventors: Ken Gary Pomaranski, Roseville, CA (US); Andy Harvey Barr, Roseville, CA (US); Dale John Shidla, Roseville, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 499 days.

(21) Appl. No.: 10/663,128

(22) Filed: Sep. 16, 2003

(65) Prior Publication Data

US 2005/0060514 A1    Mar. 17, 2005

(51) Int. Cl.
*G06F 12/00* (2006.01)

(52) U.S. Cl. .................. 711/202; 711/170; 711/200; 711/204; 711/205; 711/206; 711/207; 702/58

(58) Field of Classification Search .............. 712/34; 711/165, 200, 202, 204, 205, 206, 207, 170, 711/154, 159, 161, 162; 714/5, 6, 7, 8, 25, 714/30, 710; 702/58
See application file for complete search history.

(56) References Cited

U.S. PATENT DOCUMENTS

| 5,274,645 | A | * | 12/1993 | Idleman et al. ............... 714/6 |
| 5,381,544 | A | | 1/1995 | Okazawa et al. |
| 5,396,619 | A | | 3/1995 | Walton |
| 5,410,545 | A | | 4/1995 | Porter et al. |
| 5,463,767 | A | | 10/1995 | Joichi et al. |
| 5,495,491 | A | | 2/1996 | Snowden et al. |
| 5,721,828 | A | * | 2/1998 | Frisch ......................... 709/217 |
| 5,835,704 | A | | 11/1998 | Li et al. |
| 5,867,642 | A | * | 2/1999 | Vivio et al. .................... 714/8 |
| 5,937,367 | A | | 8/1999 | Eckardt |
| 6,058,047 | A | | 5/2000 | Kikuchi |
| 6,138,257 | A | * | 10/2000 | Wada et al. ................. 714/724 |
| 6,182,162 | B1 | | 1/2001 | Estakhri et al. |
| 6,353,870 | B1 | | 3/2002 | Mills et al. |
| 6,363,502 | B1 | * | 3/2002 | Jeddeloh ........................ 714/52 |
| 6,393,545 | B1 | * | 5/2002 | Long et al. ..................... 712/34 |
| 6,438,638 | B1 | | 8/2002 | Jones et al. |
| 6,453,398 | B1 | * | 9/2002 | McKenzie ................... 711/165 |
| 6,523,135 | B1 | * | 2/2003 | Nakamura .................... 714/30 |

(Continued)

FOREIGN PATENT DOCUMENTS

JP    2000-222236    8/2000

OTHER PUBLICATIONS

A GB Search Report for Application No. GB0418973.4 mailed on Dec. 13, 2004 (3 pages).

(Continued)

*Primary Examiner*—Stephen C. Elmore
*Assistant Examiner*—Daniel Kim

(57) ABSTRACT

An example memory quality assuring system is provided. The system may include a memory mapping logic configured to facilitate accessing memory locations and redirecting memory accessing operations. The system may also include a memory quality assurance logic configured to logically replace a first memory location with a second memory location, to initiate testing logically isolated memory locations, and to selectively logically remove tested memory locations based on the testing.

It is emphasized that this abstract is provided to comply with the rules requiring an abstract that will allow a searcher or other reader to quickly ascertain the subject matter of the application. It is submitted with the understanding that it will not be employed to interpret or limit the scope or meaning of the claims 37 CFR 1.72(b).

44 Claims, 11 Drawing Sheets

U.S. PATENT DOCUMENTS

| | | | |
|---|---|---|---|
| 6,742,148 B1 * | 5/2004 | Korhonen | 714/718 |
| 6,931,582 B2 | 8/2005 | Tamura et al. | |
| 2001/0025359 A1 | 9/2001 | Tanaka | |
| 2001/0037435 A1 * | 11/2001 | Van Doren | 711/153 |
| 2003/0065470 A1 | 4/2003 | Maxham | |
| 2003/0125908 A1 | 7/2003 | Wynn et al. | |
| 2004/0024970 A1 * | 2/2004 | Chauvel et al. | 711/133 |
| 2004/0068679 A1 | 4/2004 | Vellolil et al. | |
| 2004/0143719 A1 * | 7/2004 | Nguyen et al. | 711/202 |
| 2004/0169885 A1 * | 9/2004 | Mellor et al. | 358/1.16 |
| 2005/0044467 A1 * | 2/2005 | Leung et al. | 714/763 |
| 2005/0050276 A1 * | 3/2005 | Shidla et al. | 711/118 |

OTHER PUBLICATIONS

David A. Patterson and John L. Hennessy, Computer Architecture A Quantitative Approach, 1996, Morgan Kaufmann Publishers, Inc., Second Edition, pp. 375-381.

First Office Action in U.S. Appl. No. 10/652,536 dated Jan. 23, 2006.

Response to First Office Action in U.S. Appl. No. 10/652,536 filed May 23, 2006.

Final Office Action in U.S. Appl. No. 10/652,536 dated Jun. 27, 2006.

IDS in U.S. Appl. No. 10/652,536 filed Feb. 14, 2005.

* cited by examiner

MEMORY QUALITY ASSURANCE

CROSS REFERENCE TO RELATED APPLICATIONS

This application is related to the following U.S. patent application, which is assigned to the present assignee: "System and Method For Testing Memory", Ser. No. "10/652,536" filed Aug. 29, 2003, inventors: Shidla, Barr, and Pomamnski.

BACKGROUND

Computer systems, and other electronic systems may have electronic memory. Some of this may be referred to as "main memory". Main memory may be built from, for example, dynamic random access memory (DRAM) chips. The DRAMs may be organized, for example, onto memory boards or partitioned into dual in line memory modules (DIMMS). Memory may experience errors like transient single bit errors, multi-bit errors, stuck-at single bit errors, and the like, which can negatively impact the systems in which the memory is located.

An operating system or other control system associated with the computer or electronic system may regard the memory as a logical pool of available memory. The operating system may virtualize the available memory so that it can be managed, shared, accessed and so on by various operating system instances (e.g., applications, threads, processes, programs). Thus, physical memory addresses may be translated to virtual memory addresses and vice versa by one or more logics.

Memory usage may vary during system operation depending, for example, on the type, number, size and so on, of applications running on a system. The variance may lead to some memory areas being used frequently while others are used less frequently. If a system is configured to detect memory errors, then errors in more frequently used areas may be more likely to be discovered, accounted for, handled, and so on than errors in less frequently used areas. Thus, errors in less frequently used areas may go undiscovered and may eventually evolve into catastrophic errors as the errors accumulate.

Conventional systems may have employed application level "software memory scrubbing" techniques in an attempt to exercise memory, and to discover, account for, and perhaps correct certain memory errors. However, conventional software memory scrubbing may negatively impact system performance by disturbing (e.g., interrupting, halting, messaging) an operating system, control system, or user level application and/or by consuming non-memory resources (e.g., processor cycles, file table entries, process table entries) that would otherwise be available for operating system instances. Furthermore, conventional software memory scrubbing may not be able to access all or even substantially all of the memory in a system if some memory is locked by an operating system, control system, operating system instance, or the like. Additionally, some memory may not be accessible if memory has been partitioned by, for example, an operating system. Thus, errors may still go undetected and may accumulate in areas that software memory scrubber does not reach. Even if a conventional software scrubber detects a memory area that may have suspect qualities (e.g., parity error detected in location), the application may be limited in its response to the detected error. For example, a software memory scrubbing application may log an error location. The log may then be read by a separate diagnostic software application after a system shutdown and reboot.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
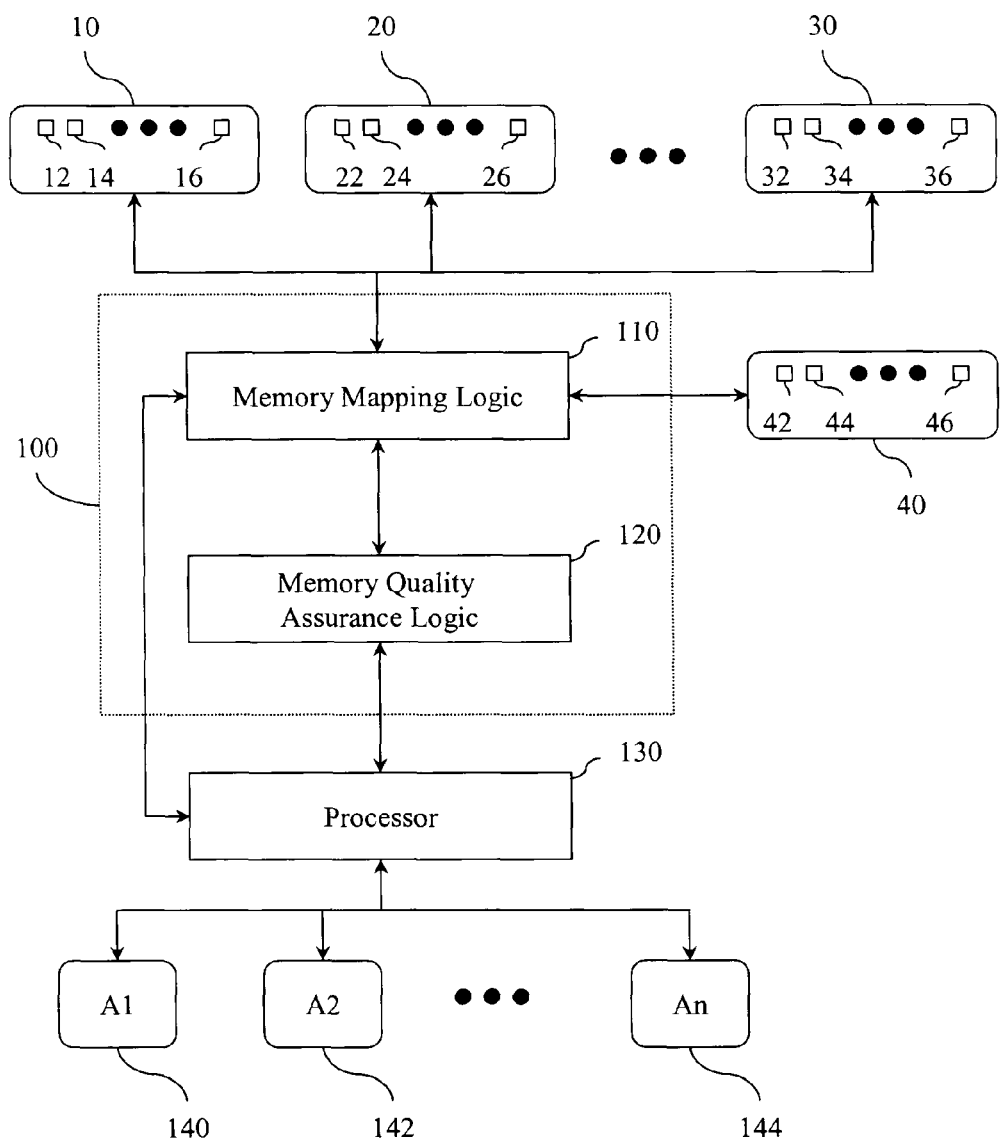
FIG. 1 illustrates an example memory quality assurance system.

This application describes example systems, methods, computer-readable mediums and so on associated with assuring the quality of electronic memory without disturbing operating system instances. The example systems, methods, computer-readable mediums and so on facilitate exercising memory to detect memory errors, where the exercising occurs in parallel and/or substantially in parallel with normal system operation without disturbing normal system operation (e.g., halting an application whose memory is being tested). In one example, the exercising does not engage user applications, operating systems or other similar control systems and thus does not interfere with the performance of such applications, operating systems and so on. In one example, memory errors can be detected, predicted, and/or accounted for pro-actively without involving a user level application or operating system.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, optical or magnetic disks, dynamic memory and the like. Transmission media may include coaxial cables, copper wire, fiber optic cables, and the like. Transmission media can also take the form of electromagnetic radiation, like those generated during radio-wave and infra-red data communications, or take the form of one or more groups of signals. Common forms of a computer-readable medium include, but are not limited to, an application specific integrated circuit (ASIC), a compact disc (CD), a digital video disk (DVD), a random access memory (RAM), a read only memory (ROM), a programmable read only memory (PROM), an electronically erasable programmable read only memory (EEPROM), a disk, a carrier wave, a memory stick, a floppy disk, a flexible disk, a hard disk, a magnetic tape, other magnetic media, a CD-ROM, other optical media, punch cards, paper tape, other physical media with patterns of holes, an EPROM, a FLASH-EPROM, or other memory chip or card, and other media from which a computer, a processor or other electronic device can read. Signals used to propagate instructions or other software over a network, like the Internet, can be considered a "computer-readable medium."

"Logic", as used herein, includes but is not limited to hardware, firmware, software and/or combinations of each to perform a function(s) or an action(s), and/or to cause a function or action from another component. For example, based on a desired application or needs, logic may include a software controlled microprocessor, discrete logic like an ASIC, a programmed logic device, a memory device containing instructions, or the like. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to one or more electrical or optical signals, analog or digital, one or more computer or processor instructions, messages, a bit or bit stream, or other means that can be received, transmitted and/or detected.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend on, for example, requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein include programming languages and tools like Java, Pascal, C#, C++, C, CGI, Perl, SQL, APIs, SDKs, assembly, machine, firmware, microcode, and/or other languages and tools. Software, whether an entire system or a component of a system, may be embodied as an article of manufacture and maintained as part of a computer-readable medium as defined previously. Another form of the software may include signals that transmit program code of the software to a recipient over a network or other communication medium.

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

An "operable connection", or a connection by which entities are "operably connected", is one in which signals, physical communication flow, and/or logical communication flow may be sent and/or received. Typically, an operable connection includes a physical interface, an electrical interface, and/or a data interface, but it is to be noted that an operable connection may include differing combinations of these or other types of connections sufficient to allow operable control.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 illustrates a memory quality assurance system 100. The system 100 facilitates testing memory substantially in parallel with normal system operation without operating system or user application level involvement. The system 100 selectively and temporarily mirrors then logically replaces main memory locations with spare memory locations while maintaining normal system operation. The system 100 then tests or has tested on its behalf the logically replaced main memory location(s). While the testing is in progress, memory accesses intended for those memory location(s) being tested are redirected to spare memory location(s). In some cases, where the memory testing reveals an error, the main memory location(s) may be logically removed from the main memory and the temporary logical replacement(s) extended to logically replace the tested memory location(s).

The system 100 accesses main memory. The main memory may be allocated, for example, into various sets of memory associated with various operating system instances (e.g., programs, applications, threads, processes). Thus, a first set of memory 10 may include, for example, memory locations 12, and 14 through 16. The first set of memory 10 may be, for example, a relatively small set of memory (e.g., 10K) or a relatively larger set of memory (e.g., 16G). Similarly, a second set of memory 20 may include, for example, memory locations 22, and 24 through 26 while a third set of memory 30 may include, for example, memory locations 32, and 34 through 36. While three sets of memory are illustrated it is to be appreciated that at various points in time that various computer systems may have a greater and/or lesser number of sets of memory of various sizes allocated to various threads, processes, operating system instances, and so on.

In one example, the system 100 may also access a separate set of memory, which may be referred to as "spare memory" 40. The spare memory 40 may include, for example, memory locations 42, and 44 through 46. Once again, it is to be appreciated that the spare memory 40 may be of various sizes. While the spare memory 40 is illustrated separate from the main memory, it may physically be a part of the main memory while being logically separated out. In one example, the spare memory 40 is memory that is known to have quality attributes exceeding a pre-determined, configurable threshold (e.g. no memory errors in last 1 million accesses).

The system 100 may include a memory mapping logic 110 that can interact with a memory quality assurance logic 120 to facilitate memory quality assurance testing. The memory mapping logic 110 can be configured to provide access to memory locations. By way of illustration, a processor 130 that is processing a set of applications (e.g., A1 140 through An 144, n being an integer) may seek access to various memory locations. For example, the processor 130 may wish to perform a memory accessing operation like an input/output operation (i/o) to a memory location. Performing the i/o may include the processor 130 sending a memory address to the memory mapping logic 110. The memory mapping logic 110 may then resolve the address and send one or more signals to a physical memory location to perform the i/o. In one example, the memory mapping logic 110 can be configured to redirect a memory accessing operation intended for a first memory location to a second memory location. Thus, an i/o intended for a main memory location can be directed to a spare memory location. In one example, the spare memory 40 may be located in the memory mapping logic 110 while in another example the spare memory 40 may be located in the memory quality assurance logic 120.

By way of further illustration, application A1 140 may want to write a value to memory. The processor 130 may therefore perform an output operation. The output operation can include sending a memory address to the memory mapping logic 110. The memory mapping logic 110 may resolve the memory address and complete the output operation to memory location 12 in memory set 10, which may be associated with application A1 140. Similarly, application A2 142 may want to read a value from memory. The processor 130 may therefore perform an input operation. The input operation can include sending a memory address to the memory mapping logic 110, which resolves the memory address and completes the input operation from memory location 26 in memory set 20, where memory set 20 is associated with application A2 142. However, if the memory mapping logic 110 has been reconfigured by the memory quality assurance logic 120, then the input operation may have taken a value from memory location 42 in spare memory 40 rather than from memory location 26 in memory set 20. Thus, a first memory location (e.g. 26) can be logically replaced by a second memory location (e.g. 42) leaving the first memory location logically isolated and available for testing.

The memory quality assurance logic 120 may track memory ownership relationships between operating system instances (e.g., applications) and physical memory locations. Additionally the memory quality assurance logic 120 may store memory redirection data like main memory addresses that have been logically replaced by spare memory addresses and the relationships between them. Thus, in one example, the memory quality assurance logic 120 may include one or more data stores configured to store one or more, of a memory freshness data, a memory quality data, an operating system instance to physical memory location relationship data, and a memory reconfiguration data. In another example, the memory quality assurance logic 120 may include a microprocessor, a memory and a non-volatile memory. The non-volatile memory may store, for example, memory location freshness data (e.g., how recently it has been accessed and/or error checked) and/or memory location quality data (e.g., error rate, error types). In another example, the memory quality assurance logic 120 may be operably connected to one or more data stores configured to store one or more, of a memory freshness data, a memory quality data, an operating system instance to physical memory location relationship data, and a memory reconfiguration data.

The memory quality assurance logic 120 may be configured to select a memory location to error check. The selection may be made by methods including, but not limited to, linearly (e.g., memory locations chosen in order), round-robin (e.g., memory locations chosen in order, then loop back to first location after last location is chosen and continue), randomly, most frequently used, least frequently used, and so on. The memory quality assurance logic 120 may also be configured to select a location in spare memory 40 to participate in the error checking. The memory quality assurance logic 120 may be configured to send one or more signals that cause the copying of the contents of the memory location to be error checked to the selected spare memory location. The memory quality assurance logic 120 may also send one or more signals to the memory mapping logic 110 that cause future memory accessing requests initially destined for the memory location to be error checked to be routed to the selected spare memory location. The memory quality assurance logic 120 may also send one or more signals that initiate error checking the memory location to be error checked. For example, the memory quality assurance logic 120 may send a diagnostic initiating signal to a memory board or memory chip associated with the memory location to be error checked. The memory board or memory chip may then perform diagnostics (e.g., error checking) on the memory location. The diagnostics may be stored, for example, in hardware, firmware, and/or software on the memory board or chip. These diagnostics may facilitate determining whether a memory location is experiencing memory errors (e.g., parity errors, stuck bit errors). Note that performing these diagnostics does not engage the operating system or user level applications. The operating system, control system, user applications, operating system instances and so on that access the memory may not even be aware that the diagnostics are being performed. Thus, the error checking may be done on-the-fly (e.g., during normal system operation without a halt or reboot) while remaining transparent (e.g., not halting or consuming resources) to operating system instances.

The results of the diagnostics can be reported, for example, to the memory quality assurance logic 120. Based on the results of the diagnostics, the memory quality assurance logic 120 may determine that the memory location has quality attributes exceeding a pre-determined configurable quality threshold (e.g., passed error checking) and thus send one or more signals to the memory mapping logic 110 to logically return the tested memory location to main memory and/or to reestablish a relationship between the memory location and an application, for example. Thus, subsequent memory access requests initially destined for the memory location that was error checked will be delivered to the memory location that was error checked rather than to the spare memory location. Similarly, based on the results of the diagnostics, the memory quality assurance logic 120 may determine that the memory location has quality attributes falling below a pre-determined, configurable quality threshold (e.g., failed error checking). Thus the memory quality assurance logic 120 may decide to logically remove the memory location from main memory and send zero or more signals to the memory mapping logic 110 so that subsequent memory accessing requests initially destined for the memory location that was error checked will continue to be delivered to the spare memory location. In another example, the memory quality assurance logic 120 may be configured to identify an alternate memory location in the memory set in which the memory location to be tested is located and send one or more signals to the memory mapping logic 110 so that subsequent memory accessing requests initially destined for the memory location that was error checked are delivered to the alternate memory location. In this way, the pool of spare memory may be preserved for future testing purposes.

Figure 2:
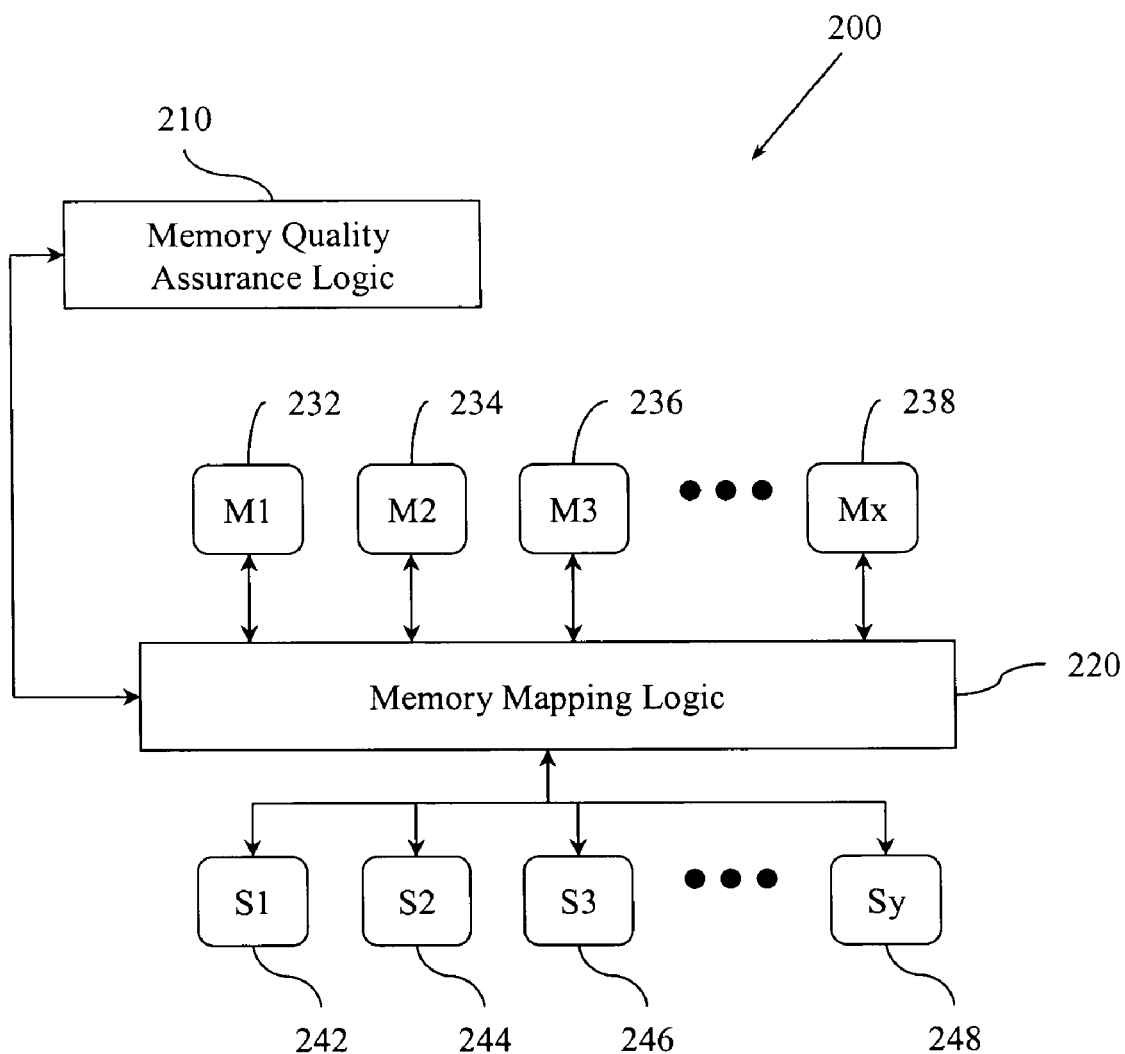
FIG. 2 illustrates an example memory quality assurance logic.

FIG. 2 illustrates a system 200 that includes an example memory quality assurance logic 210. The memory quality assurance logic 210 may be configured to interact with a memory mapping logic 220 to facilitate actions including, but not limited to, examining memory, exercising memory, detecting memory errors, and handling memory address remapping to mitigate the effects of memory errors. In one example, the memory mapping logic 220 may include a crossbar that facilitates resolving and/or redirecting memory addresses. In another example, the memory mapping logic 220 may include one or more programmable address translation tables that facilitate resolving and/or redirecting memory addresses. Thus, in one example, the memory quality assurance logic 210 may reconfigure the memory mapping logic 220 by reprogramming the crossbar. In another example, the memory quality assurance logic 210 may reconfigure the memory mapping logic 220 by reprogramming one or more entries in one or more address translation tables. While a crossbar and an address translation table are described, it is to be appreciated that other address mapping and/or resolving apparatus, methods, and data stores may be employed.

The memory quality assurance logic 210 may store information about a physical memory space (e.g., a main memory space). For example, the main memory space may include memory locations M1 232, M2 234, and M3 236 through Mx 238, x being an integer. The main memory space may be relatively small (e.g., 1K in an embedded system) or relatively large (e.g., 64 TB in a server). The memory quality assurance logic 210 may also store information about a "spare memory" space. In one example, the spare memory space may be located in a separate set of memory chips, boards and so on, while in another example the spare memory space may be logically partitioned from memory chips, boards and so on associated with the main memory space. Thus, the memory quality assurance logic 210 may include and/or be operably connected to one or more data stores configured to store one or more of, a memory freshness data, a memory quality data, an operating system instance to physical memory location relationship data, and a memory reconfiguration data.

The memory quality assurance logic 210 can be configured to control (e.g., program) the memory mapping logic 220 so that memory access requests intended for a main memory location can be redirected to a spare memory location. Similarly, the memory quality assurance logic 210 can be configured to copy, or have the memory mapping logic 220 or some other component copy, or to control copying the contents of a main memory location between a spare memory location. Similarly, the memory quality assurance logic 210 can be configured to copy, or to cause another component to copy, or to control copying the contents of a first main memory location between a second main memory location.

Thus, in one example, the memory quality assurance logic 210 may be configured to select a memory location to test. The memory location may be chosen by methods like linear, round-robin, random, most frequently used, least frequently used, and so on. Similarly, the memory quality assurance logic 210 may be configured to select a spare memory location to hold the contents of the memory location to be tested. Once again, the spare memory location can be chosen by various methods (e.g., linear, random, round-robin).

The memory quality assurance logic 210 can also be configured to copy, control, and/or to initiate copying the contents of the memory location to be tested to the spare memory location. For example, the memory quality assurance logic 210 may send a signal to the memory mapping logic 220 that causes a direct memory transfer between the two memory locations.

The memory quality assurance logic 210 can also be configured to selectively reconfigure (e.g., reprogram) the memory mapping logic 220 so that a memory accessing request (e.g., an i/o request) to a main memory location (e.g., M1 232) that has been selected to test will be redirected to the selected spare memory location (e.g., S1 242).

The memory quality assurance logic 210 can also be configured to run and/or initiate the running of tests (e.g., functional, electrical) on the memory location to be tested. The memory quality assurance logic 210 can also be configured to perform actions like storing, analyzing, and reporting the results of the testing. The memory quality assurance logic 210 can also be configured to selectively respond to the memory test results. For example, if the tests reveal that a memory location should be logically removed from the active main memory pool, then the memory quality assurance logic 210 may make the temporary remapping in the memory mapping logic 220 more permanent and/or may establish a more permanent remapping to another memory location. This effectively logically removes the tested main memory location from main memory and replaces it with a different memory location. In one example, the logical removal and replacement can be accomplished without interacting with an operating system, user application, or so on. Additionally, a running operating system, user application, and the like may not even be aware that the testing, removal and replacement occurred.

Thus, examining FIG. 2, consider a memory test that proceeds linearly from M1 232 through Mx 238. At a first point in time, the contents of M1 232 may be copied to S1 242. Then, the memory quality assurance logic 210 may reprogram the memory mapping logic 210 to redirect memory accessing requests for M1 232 to S1 242. Then, the memory quality assurance logic 210 may perform and/or initiate memory tests on memory location M1 232. After testing M1 232, if the memory location exhibits quality attributes that exceed a pre-determined, configurable quality threshold, then the memory quality assurance logic 210 may copy or initiate the copying of the contents of S1 242 back to M1 232 and reprogram the memory mapping logic 210 so that memory accessing requests for M1 232 are no longer delivered to S1 242 but are subsequently delivered to M1 232. The memory quality assurance logic 210 may be configured to step through the main memory pool so that all and/or substantially all of the main memory pool is eventually tested. For example, after testing M1 232, the memory quality assurance logic 210 may mirror, swap, and test M3 236, then Mx 238, then M2 234, and so on.

Suppose that during the testing the memory quality assurance logic 210 determines that the quality of M2 234 has fallen below a pre-determined, configurable quality threshold. The memory quality assurance logic 210 may then cause a spare memory location to more permanently take the place of M2 234. This is the situation depicted in FIG. 3 where a replacement memory location has logically replaced a logically removed main memory location. "Logically replaced" means that memory accessing requests for the tested memory location will access the replacing memory location. "Logically replaced" does not mean that physical memory apparatus is physically moved from one place to another. Similarly, "logically removed" means that a memory location is no longer accessed by operating system and/or user level applications that are not aware of the logical replacement. The physical apparatus associated with the memory location need not be physically removed from the main memory to effect the logical removal.

Figure 3:
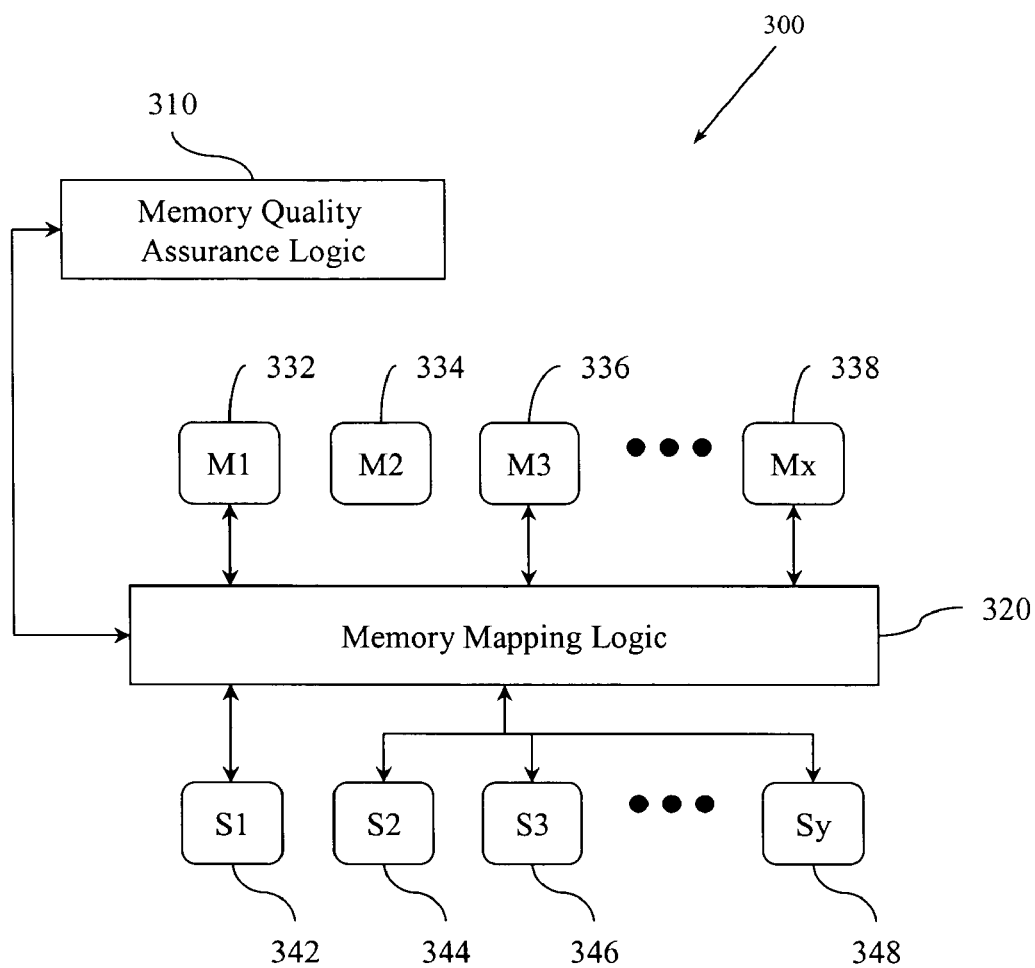
FIG. 3 illustrates another example memory quality assurance logic.

FIG. 3 illustrates a system 300 that includes an example memory quality assurance logic 310 that has interacted with a memory mapping logic 320 to logically replace a main memory location M2 334 with a spare memory location S1 342. The memory quality assurance logic 310 may have stepped through the main memory (e.g., locations M1 332, M2 334, and M3 336 through Mx 338) and determined that the quality of M2 334 had fallen below a pre-determined, configurable quality threshold. While performing the memory tests, the memory quality assurance logic 310 may have been using spare memory location S1 342 for logically replacing (e.g., mirroring and swapping) the contents of main memory locations. Thus, when M2 334 was determined to be in condition for replacement, the memory quality assurance logic 310 may have reprogrammed the memory mapping logic 320 so that future memory accessing requests for M2 334 were delivered to S1 342 and so that M2 334 was logically removed from the main memory pool. Therefore, for subsequent memory quality assurance testing, the memory quality assurance logic 310 may select between the remaining spare memory locations (e.g., S2 344, and S3 346 through Sy 348, y being an integer).

Figure 4:
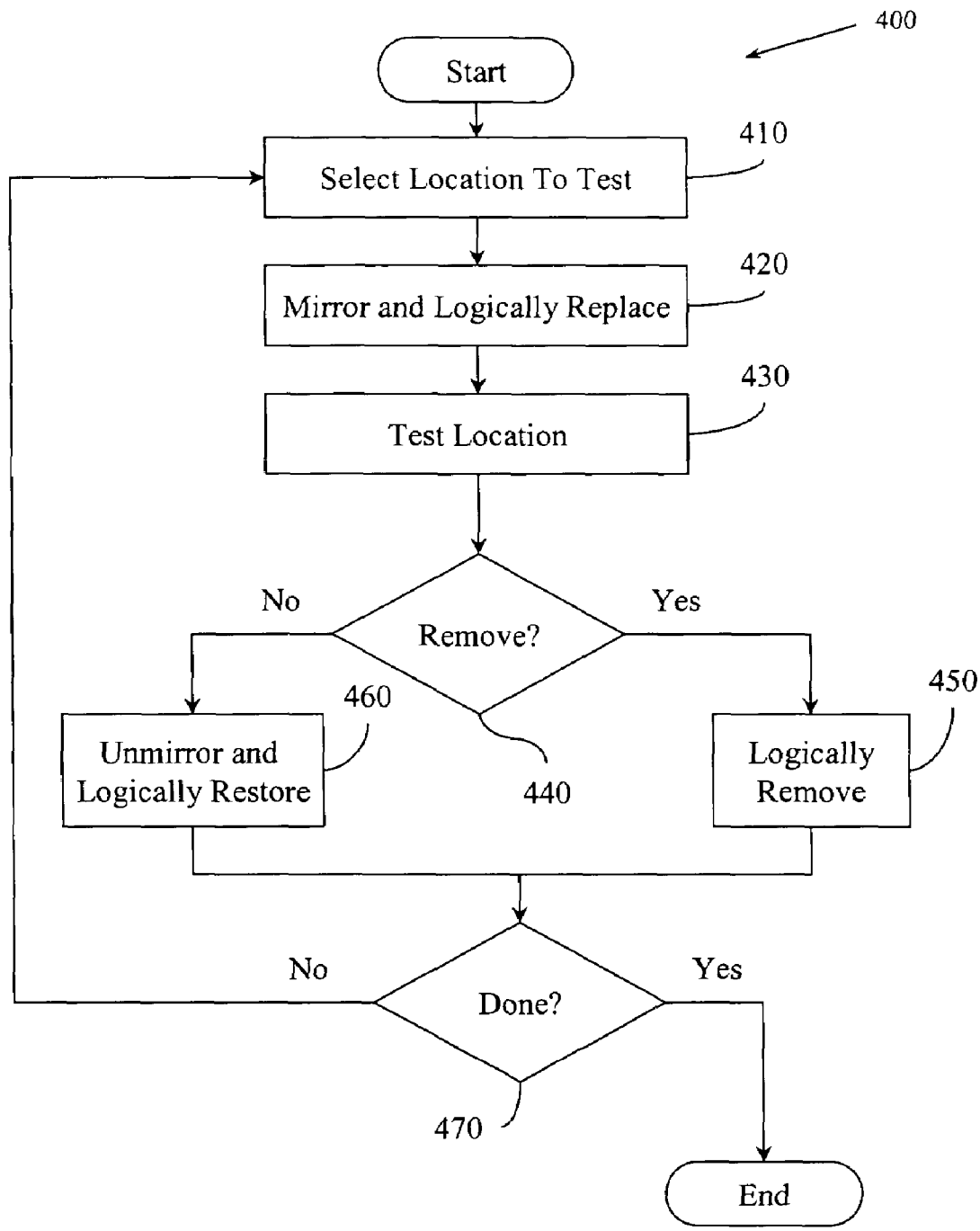
FIG. 4 illustrates an example memory quality assurance method.
Figure 5:
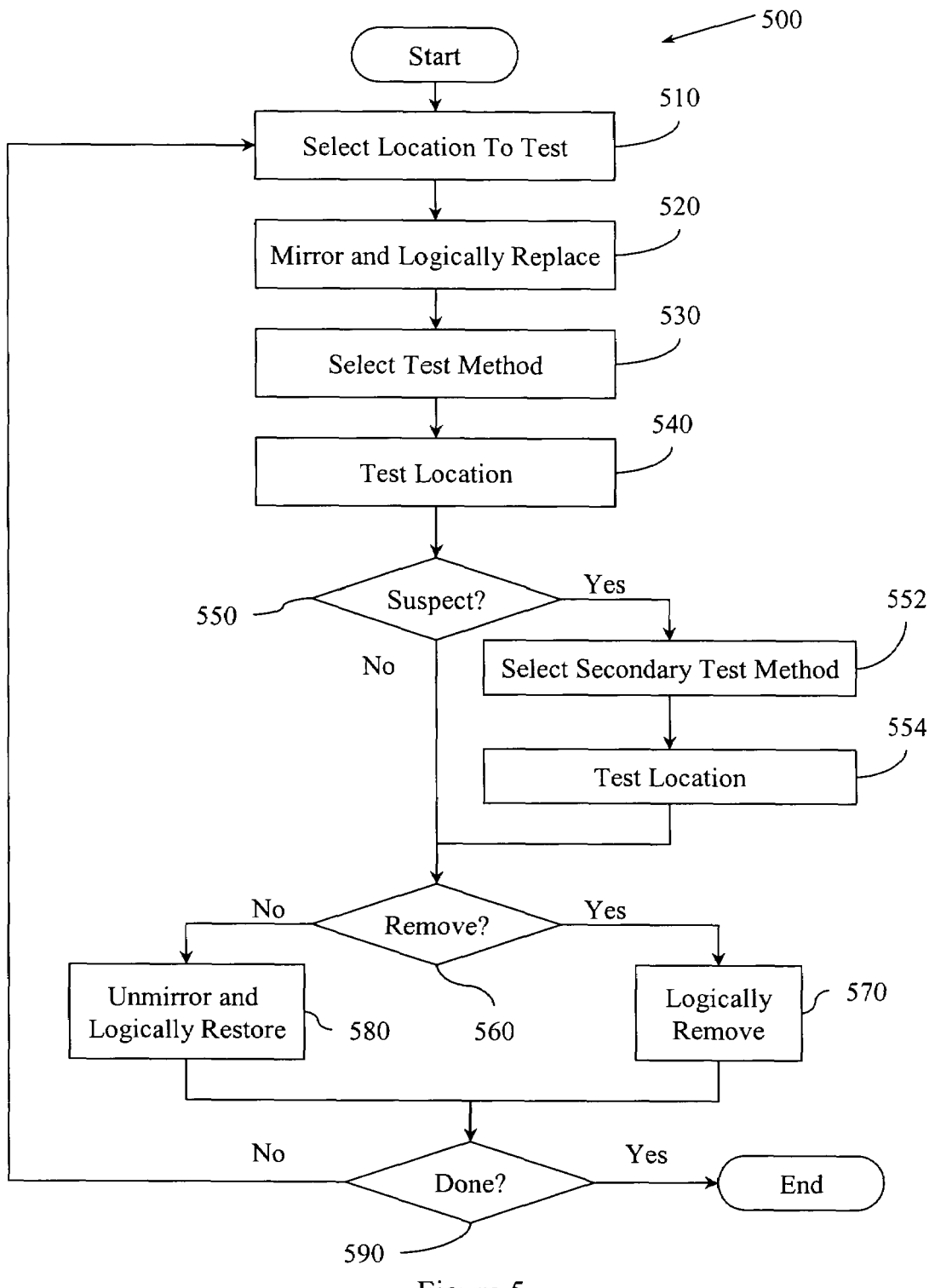
FIG. 5 illustrates another example memory quality assurance method.

Example methods may be better appreciated with reference to the flow diagrams of FIGS. 4 and 5. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks. In one example, methodologies are implemented as processor executable instructions and/or operations stored on a computer-readable medium.

In the flow diagrams, blocks denote "processing blocks" that may be implemented, for example, in software. Additionally and/or alternatively, the processing blocks may represent functions and/or actions performed by functionally equivalent circuits like a digital signal processor (DSP), an ASIC, and the like.

A flow diagram does not depict syntax for any particular programming language, methodology, or style (e.g., procedural, object-oriented). Rather, a flow diagram illustrates functional information one skilled in the art may employ to fabricate circuits, generate software, or use a combination of hardware and software to perform the illustrated processing. It will be appreciated that in some examples, program elements like temporary variables, routine loops, and so on are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 4 illustrates an example memory quality assurance method 400. The method 400 may include, at 410, selecting and/or identifying a memory location to test. While method 400 illustrates selecting and/or identifying a memory location to test, it is to be appreciated that in one example the address of the memory location to test may be provided to the method 400. The memory location may be, for example, a main memory location. The main memory location may be located, for example, in a DRAM. The DRAM may be located on a DIMM. The board on which the DRAM/DIMM is located or plugged into may have built in diagnostics that are stored, for example, in firmware, hardware, and/or software. The location to test may be selected by methods including, but not limited to, linear, random, most frequently used, least frequently used, most recently exhibiting an error, least recently exhibiting an error, and so on.

The method 400 may also include, at 420, logically replacing (e.g., mirroring and swapping) the memory location to test with a spare memory location. The mirroring may involve, for example, copying the contents of the memory location to test to the spare memory location. At 420, the method 400 may also include redirecting memory access requests (e.g., i/o requests) from the memory location to test to the spare memory location. The redirecting may be performed by, for example, reprogramming a crossbar and/or a memory address translation table. Thus, at 430, the memory location to test is logically isolated and can be tested while memory access requests are diverted to the spare memory location. The tests may include, for example, electrical, functional, parity, marching one, marching zeroes, stripe, "worst-case" pattern and other tests.

At 440, a determination is made concerning whether to logically remove the memory location that is tested at 430. If the determination at 440 is Yes, that the memory location should be logically removed from main memory, then at 450 the logical removal may be completed. In one example, a temporary diversion from the memory location to the spare memory location may be made more permanent. In another example, the contents of the spare memory location may be mirrored to a second main memory location and an additional address remapping performed so that memory accessing requests intended for the tested and failed main memory location are directed to the second memory location. If the determination at 440 is No, that the memory location should not be logically removed, then the contents of the spare memory location can be copied back into the main memory location and the redirecting undone so that subsequent memory accessing requests are delivered to the main memory location and not the spare memory location.

While FIG. 4 illustrates various actions occurring in serial, it is to be appreciated that various actions illustrated in FIG. 4 could occur substantially in parallel. By way of illustration, a first process could select units to test and/or prepare a set of units to test so that the next unit to test is available substantially immediately. The set of units to test may be stored in a data store. Similarly, a second process could mirror and swap (e.g., logically replace) locations to test with spare memory locations. If multiple locations to test have been identified by the first process, and if multiple spare memory locations are available, then multiple tests may be run by one or more third processes substantially in parallel. While three processes are described, it is to be appreciated that a greater and/or lesser number of processes could be employed and that lightweight processes, regular processes, threads, and other approaches could be employed.

FIG. 5 illustrates an example memory quality assurance method 500. The method 500 includes a two step process for memory quality assurance testing where a first test may be employed to identify a suspect location and a second test may be employed to more rigorously test a suspect location. Method 500 includes, at 510, selecting a memory location to test. The memory location may be selected by methods like, linear, round-robin, random, most frequently used, least frequently used, and so on. While method 500 illustrates selecting and/or identifying a memory location to test, it is to be appreciated that in one example the address of the memory location to test may be provided to the method 500. At 520, the contents of the memory location are mirrored into a spare memory location that is known to have a quality level above a pre-determined configurable threshold. Also at 520, memory addressing is reprogrammed so that memory accesses intended for the selected memory location are directed to the mirroring memory location. At 530, a method for testing the memory location is selected. Test methods may include, but are not limited to, parity testing, stripe testing, marching one testing, marching zeroes testing, "worst case" pattern testing, and so on. The test method may be selected based on factors like a previous quality level for the memory location, how frequently the memory location has been used, the criticality of an application to which the memory location has been allocated, the time available to test the location, and so on. Once again, while method 500 illustrates selecting a test method at 530 and selecting a secondary test method at 552, it is to be appreciated that the test methods could be provided to method 500.

At 540, the memory location is tested. While a single memory location is described, it is to be appreciated that at 510 that two or more memory locations could be selected, that at 520 the two or more memory locations could be mirrored and swapped, that at 530 two or more test methods could be selected and that at 540 two or more memory locations could be tested, in serial, in parallel, and/or substantially in parallel. The parallel testing can be facilitated, in one example, by selecting at 530 a test method that is stored on a device associated with the memory location. For example, a memory location may be located in a DRAM on a memory board that has built in memory testing routines that can test multiple locations. Thus, two or more memory locations on the memory board may be tested serially, in parallel, and/or substantially in parallel. While the method 500 illustrates testing the location at 540, it is to be appreciated that in one example the method 500 may initiate testing at 540 and be provided with test results concerning the tested memory location.

At 550, a determination is made concerning whether a memory location is suspect. That is, did the memory testing routine(s) report that the memory location exhibited quality attributes that fell below a pre-determined configurable threshold. The threshold may be pre-determined and configurable to facilitate various levels of testing. By way of illustration, at a first time a system may be under a first relatively lighter load that makes more spare memory available for testing. Thus a first higher level of testing with a higher degree of parallelism may be undertaken. At a second time the system may be under a second relatively heavier load that makes less spare memory available for testing. Thus a second lower level of testing with a lower degree of parallelism may be undertaken. If the determination at 550 is No, then processing continues at 560. But if the determination at 550 is Yes, then at 552 a secondary test method may be selected. The secondary test method may be selected to exercise the memory location in a manner that may uncover errors associated with the suspect attributes. The secondary method may then be employed at 554.

At 560, a determination is made concerning whether to logically remove the main memory location from the pool of available memory. Results from the test at 540 and/or the test at 554 may be considered when making the determination. If the determination at 560 is Yes, then at 570 the memory location is logically removed. Otherwise, if the determination at 560 is No, then at 580, the memory location is logically returned to the pool of available memory and/or re-associated with an operating system instance with which it had been previously associated. The logical removal and/or restoration may be effected by, for example, reprogramming a crossbar, reprogramming an address translation table, and so on.

While FIG. 5 illustrates various actions occurring in serial, it is to be appreciated that various actions illustrated in FIG. 5 could occur substantially in parallel. By way of illustration, a first process could select memory locations to test, a second process could select test methods for the memory locations, a third process could initiate and monitor the testing of memory locations, a fourth process could determine whether secondary testing is desired, a fifth process could select secondary test methods, a sixth process could initiate and monitor the secondary testing and a seventh process could determine whether to logically remove tested memory locations. While seven processes are described, it is to be appreciated that a greater and/or lesser number of processes could be employed and that lightweight processes, regular processes, threads, and other approaches could be employed.

In one example, a computer-readable medium may store processor executable instructions operable to perform a method that includes selecting a first memory location to test from a first set of memory. The method may also include selecting a second memory location to logically replace the first memory location during testing and copying the contents of the first memory location to the second memory location. The method may also include logically replacing the first memory location with the second memory location by reconfiguring address resolving means. The method may also include initiating testing of the first memory location and selectively logically replacing the first memory location with the second memory location based, at least in part, on the results of the testing. While one method is described, it is to be appreciated that other computer-readable mediums could store other example methods described herein.

Figure 6:
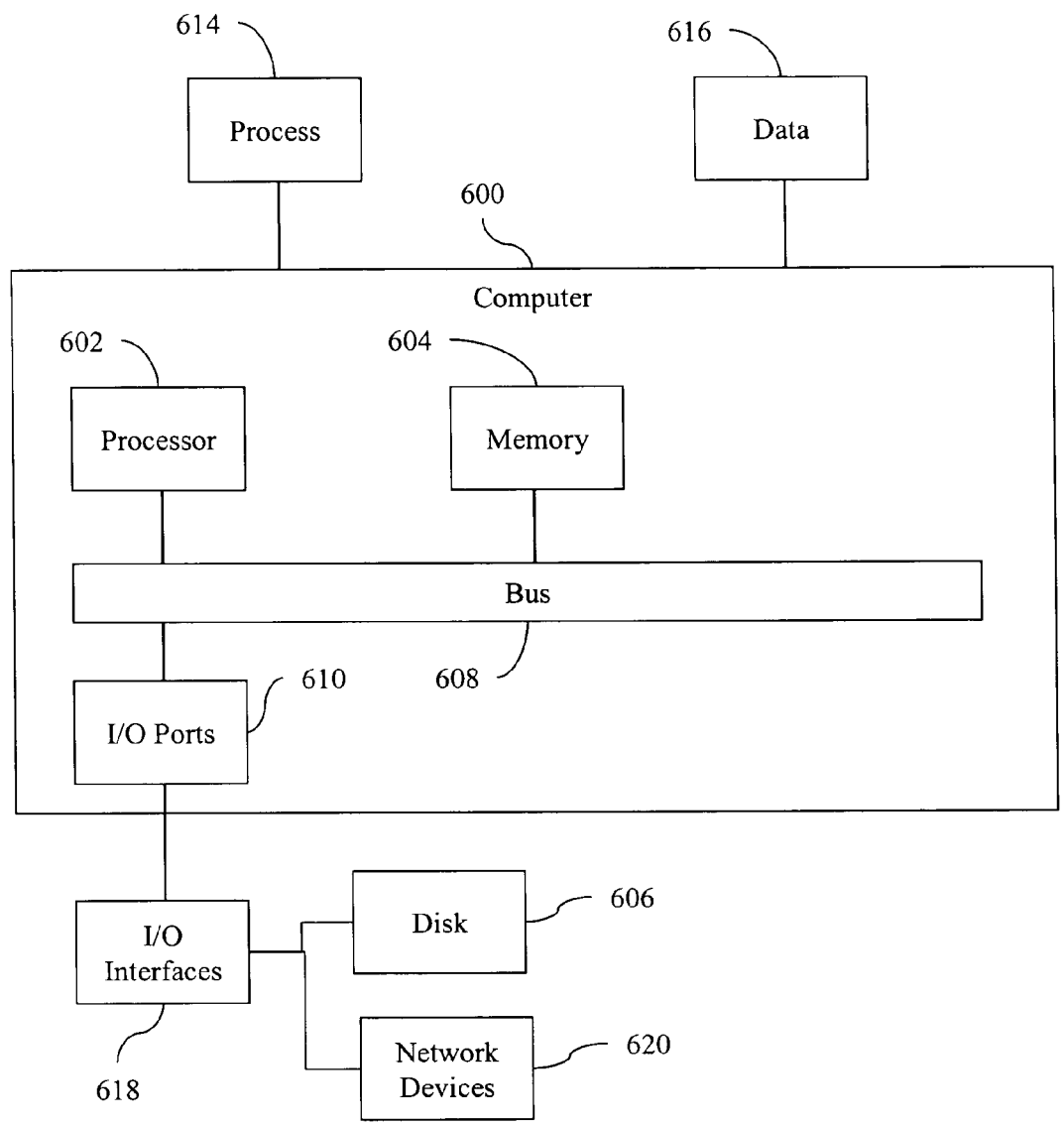
FIG. 6 illustrates an example computing environment in which example memory quality assurance systems and methods can operate.

FIG. 6 illustrates a computer 600 that includes a processor 602, a memory 604, and input/output ports 610 operably connected by a bus 608. Executable components of the systems described herein may be located on a computer like computer 600. Similarly, computer executable methods described herein may be performed on a computer like computer 600. It is to be appreciated that other computers may also be employed with the systems and methods described herein.

The processor 602 can be a variety of various processors including dual microprocessor and other multi-processor architectures. The memory 604 can include volatile memory and/or non-volatile memory. The non-volatile memory can include, but is not limited to, read only memory (ROM), programmable read only memory (PROM), electrically programmable read only memory (EPROM), electrically erasable programmable read only memory (EEPROM), and the like. Volatile memory can include, for example, random access memory (RAM), synchronous RAM (SRAM), dynamic RAM (DRAM), synchronous DRAM (SDRAM), double data rate SDRAM (DDR SDRAM), and direct RAM bus RAM (DRRAM).

A disk 606 may be operably connected to the computer 600 via, for example, an input/output interface (e.g., card, device) 618 and an input/output port 610. The disk 606 can include, but is not limited to, devices like a magnetic disk drive, a solid state disk drive, a floppy disk drive, a tape drive, a Zip drive, a flash memory card, and/or a memory stick. Furthermore, the disk 606 can include optical drives like, a compact disc ROM (CD-ROM), a CD recordable drive (CD-R drive), a CD rewriteable drive (CD-RW drive) and/or a digital video ROM drive (DVD ROM). The memory 604 can store processes 614 and/or data 616, for example. The disk 606 and/or memory 604 can store an operating system that controls and allocates resources of the computer 600.

The bus 608 can be a single internal bus interconnect architecture and/or other bus or mesh architectures. The bus 608 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 600 may interact with input/output devices via i/o interfaces 618 and input/output ports 610. Input/output devices can include, but are not limited to, a keyboard, a microphone, a pointing and selection device, cameras, video cards, displays, disk 606, network devices 620, and the like. The input/output ports 610 can include but are not limited to, serial ports, parallel ports, and USB ports.

The computer 600 can operate in a network environment and thus may be connected to network devices 620 via the i/o interfaces 618 and the i/o ports 610. Through the network devices 620, the computer 600 may interact with a network. Through the network, the computer 600 may be logically connected to remote computers. The networks with which the computer 600 may interact include, but are not limited to, a local area network (LAN), a wide area network (WAN), and other networks. The network devices 620 can connect to LAN technologies including, but not limited to, fiber distributed data interface (FDDI), copper distributed data interface (CDDI), Ethernet/IEEE 802.3, token ring/IEEE 802.5, wireless/IEEE 802.11, Bluetooth, and the like. Similarly, the network devices 620 can connect to WAN technologies including, but not limited to, point to point links, circuit switching networks like integrated services digital networks (ISDN), packet switching networks, and digital subscriber lines (DSL).

Figure 7:
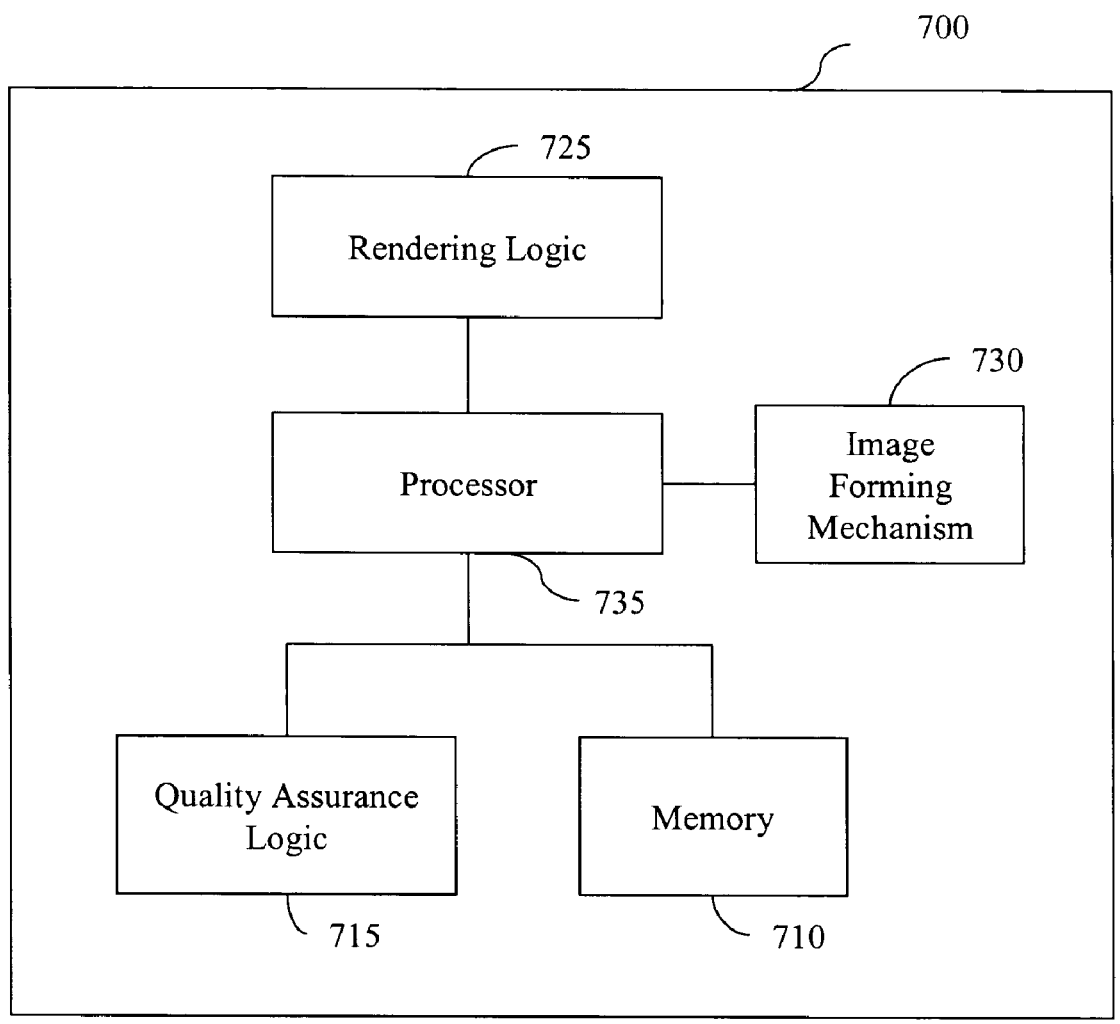
FIG. 7 illustrates an example image forming device in which example memory quality assurance systems and methods can operate.

FIG. 7 illustrates an example image forming device 700 on which the example systems and methods described herein may be implemented. The image forming device 700 may include a memory 710 configured to store print data, for example, or to be used more generally for image processing. The image forming device 700 may include a memory quality assurance logic 715 configured to participate in analyzing the quality of memory locations in memory 710, in logically removing memory locations known to have errors, and in logically replacing the removed memory locations with replacement memory locations.

The image forming device 700 may receive print data to be rendered. Thus, the image forming device 700 may include a rendering logic 725 configured to generate a printer-ready image from print data. Rendering varies based on the format of the data involved and the type of imaging device. In general, the rendering logic 725 converts high-level data into a graphical image for display or printing (e.g., the print-ready image). For example, one form is ray-tracing that takes a mathematical model of a three-dimensional object or scene and converts it into a bitmap image. Another example is the process of converting HTML into an image for display/printing. It is to be appreciated that the image forming device 700 may receive printer-ready data that does not need to be rendered and thus the rendering logic 725 may not appear in some image forming devices.

The image forming device 700 may also include an image forming mechanism 730 configured to generate an image onto print media from the print-ready image. The image forming mechanism 730 may vary based on the type of the imaging device 700 and may include a laser imaging mechanism, other toner-based imaging mechanisms, an ink jet mechanism, digital imaging mechanism, or other imaging reproduction engine. A processor 735 may be included that is implemented with logic to control the operation of the image-forming device 700. In one example, the processor 735 includes logic that is capable of executing Java instructions. Other components of the image forming device 700 are not described herein but may include media handling and storage mechanisms, sensors, controllers, and other components involved in the imaging process.

Figure 8:
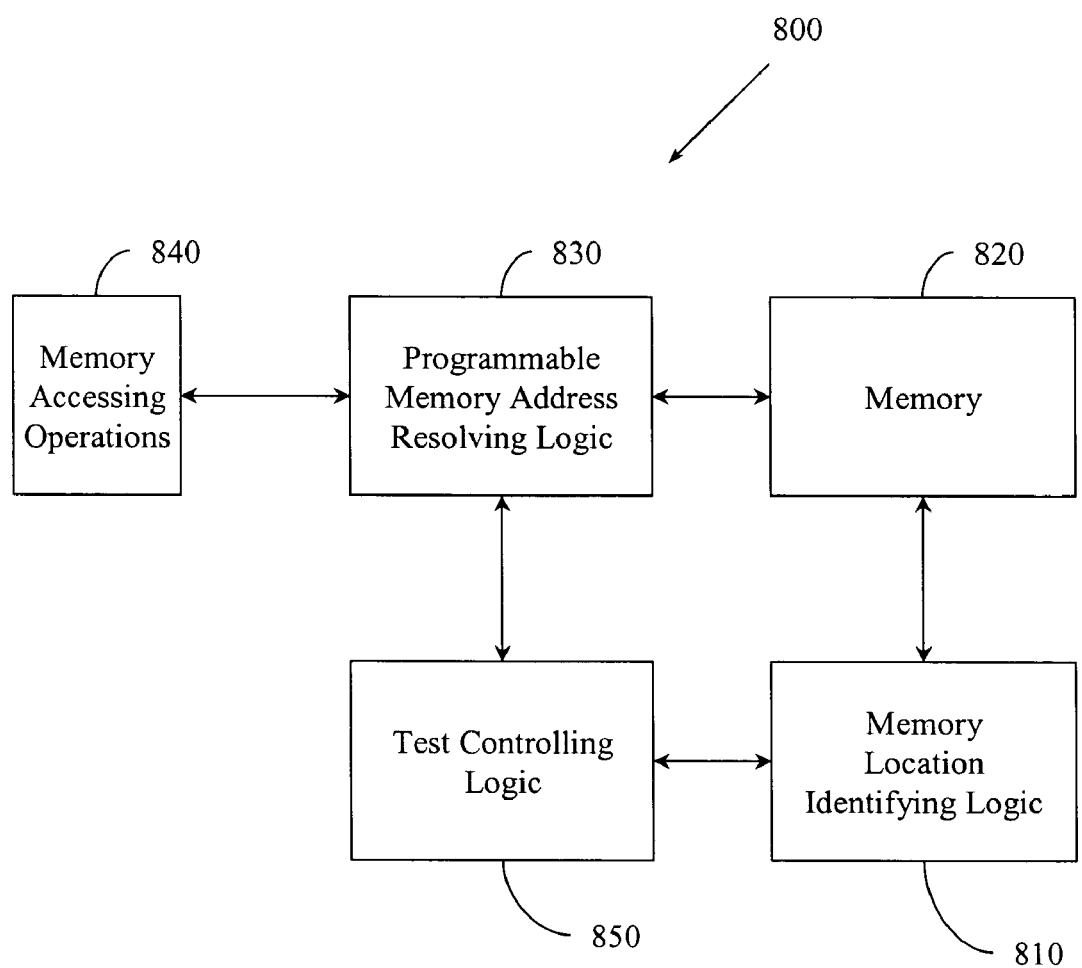
FIG. 8 illustrates an example operating system transparent system for on-the-fly memory testing.

FIG. 8 illustrates an example operating system transparent system 800 for on-the-fly memory testing. The system 800 includes a memory location identifying logic 810 configured to identify a target memory location and a replacement memory location. Thus, the memory location identifying logic 810 is operably connected to a memory 820. The memory 820 is accessible via a programmable memory address resolving logic 830 that is configured to provide access to the target memory location and the replacement memory location. The programmable memory address resolving logic 830 can be selectively reprogrammed to divert memory accessing operations from the target memory location to the replacement memory location. Thus, after mirroring the contents of the target memory location to the replacement memory location, memory accessing operations 840 that desire to access the target memory location can be completed by accessing the replacement memory location making the memory testing substantially transparent.

The system 800 also includes a test controlling logic 850 that is operably connected to the memory location identifying logic 810 and the programmable memory address resolving logic 830. The test controlling logic 850 may be configured to selectively program the programmable memory address resolving logic 830 to divert memory access operations 840 from the target memory location to the replacement memory location. The test controlling logic 850 may also be configured to initiate memory testing of the target memory location.

Note that in one example the memory location identifying logic 810, the programmable memory address resolving logic 830 and the test controlling logic 850 do not consume non-memory operating system resources like processor cycles, process table entries, file table entries, and the like. Thus, the memory testing initiated or performed by the test controlling logic 850 can occur on-the-fly (e.g., while normal system operation is occurring) and will be transparent to (e.g., not halting) memory accessing operations 840 that attempt to access the memory being tested.

Figure 9:
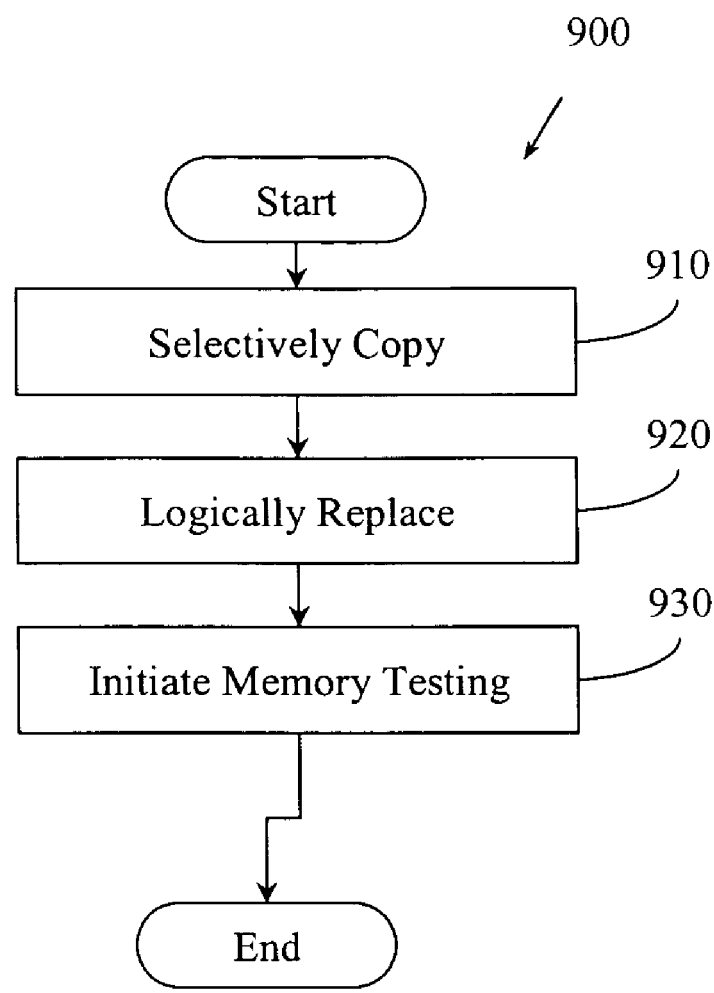
FIG. 9 illustrates an example memory quality assurance method.

FIG. 9 illustrates an example memory quality assurance method 900. The method 900 may include, at 910, selectively copying the contents of a first memory location to a second memory location. For example, the first memory location may be in main memory and the second memory location may be in main memory, a set-aside buffer, a cache, a temporary memory, and so on. The method 900 may also include, at 920, logically replacing the first memory location with the second memory location. Thus, memory access requests initially destined for the first memory location will be directed to the second memory location. Thus, the first memory location is logically isolated and available for non-intrusive testing. Thus, the method 900 may also include, at 930, initiating memory testing of the first memory location without an operating system interaction.

Figure 10:
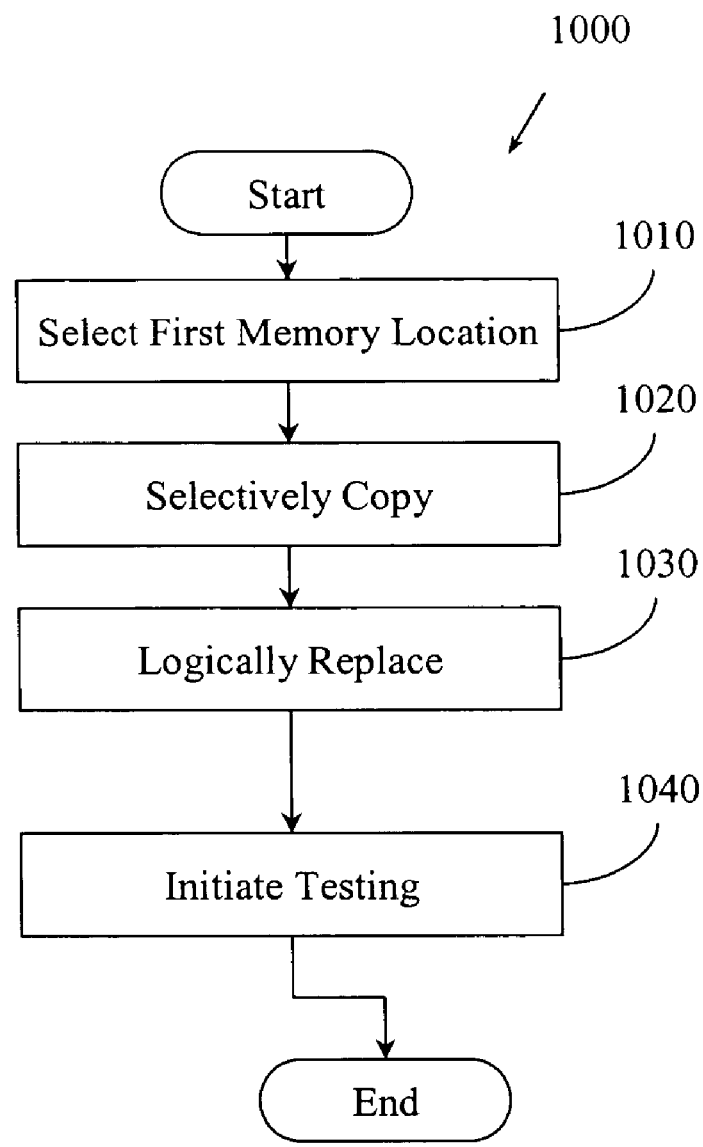
FIG. 10 illustrates another example memory quality assurance method.

FIG. 10 illustrates another example memory quality assurance method 1000. The method 1000 may include, at 1010, selecting a first memory location to test from a first set of memory. The first set of memory may be, for example, in a main memory. The first memory location may be, for example, an individually addressable unit of memory like a byte, or a block. The method 1000 may also include, at 1020, selectively copying the contents of the first memory location to a second memory location and, at 1030, logically replacing the first memory location with the second memory location. This leaves the first memory location logically isolated and thus available for non-intrusive testing (e.g., testing that will be transparent to an operating system that allocates and accesses memory). Thus, the method 1000 may also include, at 1040, initiating testing of the first memory location.

Figure 11:
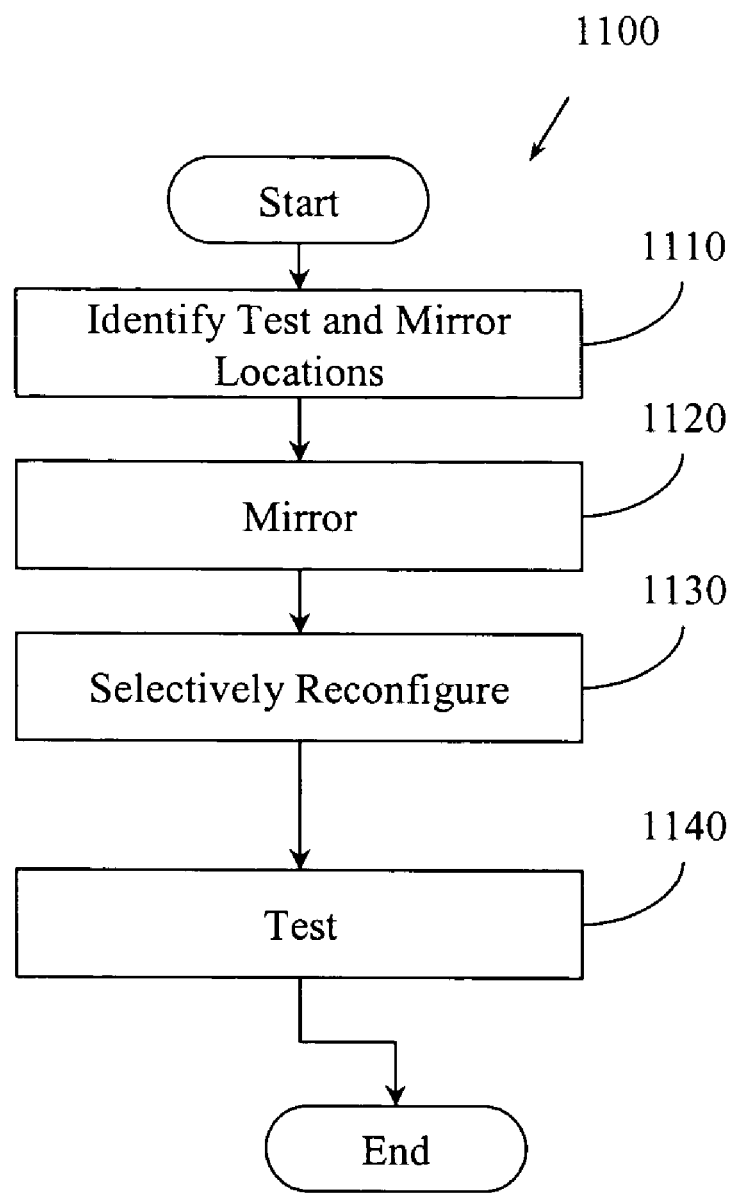
FIG. 11 illustrates an example operating system transparent method for on-the-fly memory testing.

FIG. 11 illustrates an example operating system transparent method 1100 for on-the-fly memory testing. The method 1100 may include, at 1110, identifying a test memory location and a mirroring memory location. The test memory location may be, for example, in a main memory and may be an individually addressable unit of memory like a byte, or a block. The mirroring memory location may be in main memory, a set-aside buffer, a cache, a temporary memory, and so on. The method 1100 may also include, at 1120, mirroring the test memory location to the mirroring memory location. Thus, the contents of the test memory location are preserved in the mirroring memory location.

The method 1100 may also include, at 1130, selectively reconfiguring memory accessing operations so that memory accesses originating in an operating system instance that are addressed to the test memory location are redirected to the mirroring memory location. This leaves the testing memory location logically isolated and available for non-intrusive testing. Thus, the method 1100 may also include, at 1140, testing the test memory location without disrupting an operating system instance.

While the systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on employed in memory error ranking. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicants' general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Gamer, A Dictionary of Modem Legal Usage 624 (2d. Ed. 1995).

What is claimed is:

1. A system comprising:
   a memory mapping logic configured to provide access to memory locations, where the memory mapping logic can be configured to direct a memory accessing operation intended for one memory location to another memory location; and
   a memory quality assurance logic operably connected to the memory mapping logic, where the memory quality assurance logic is configured to:

control copying contents between a first plurality of memory locations and a second plurality of memory locations;

reconfigure the memory mapping logic so that memory accessing operations intended for the first plurality of memory locations are directed to the second plurality of memory locations; and initiate memory testing of the first plurality of memory locations, where the first plurality of memory locations is less than a page of memory and where the second plurality of memory locations is less than a page of memory, where the memory mapping logic and the memory quality assurance logic do not consume operating system resources.

2. The system of claim 1, where the memory mapping logic includes a crossbar.

3. The system of claim 1, where the memory mapping logic includes one or more address translation tables.

4. The system of claim 1, where the memory quality assurance logic is configured to select the first plurality of memory locations by one or more of, a linear method, a round-robin method, a random method, a least frequently used method, a most frequently used method, a most recently exhibiting an error method, and a least recently exhibiting an error method.

5. The system of claim 1, where the memory quality assurance logic is configured to selectively logically remove a first memory location from the first plurality of memory locations by reconfiguring the memory mapping logic, based, at least in part, on a result from the memory testing of the memory location.

6. The system of claim 1, where the memory quality assurance logic is configured to selectively logically replace a first memory location with a second memory location by reconfiguring the memory mapping logic, based, at least in part, on a result from the memory testing of the first memory location.

7. The system of claim 1, where the memory quality assurance logic is configured to selectively logically replace a memory location with another memory location from first plurality of memory locations by reconfiguring the memory mapping logic based, at least in pad, on a result from the memory testing of the memory location.

8. The system of claim 1, where the memory quality assurance logic is configured to initiate memory testing of the first plurality of memory locations by sending one or more signals to a memory testing logic.

9. The system of claim 1, where the memory quality assurance logic is configured to initiate memory testing of the first plurality of memory locations by sending one or more signals to an onboard memory testing loge, where the onboard memory testing logic is physically connected to the first plurality of memory locations.

10. The system of claim 1, where the memory quality assurance logic selects the second memory location.

11. The system of claim 1, where the memory quality assurance logic includes one or more data stores configured to store one or more of, a memory freshness data, a memory quality data, an operating system instance to physical memory location relationship data, and a memory reconfiguration data.

12. The system of claim 1, where the memory quality assurance logic is operably connected to one or more data stores configured to store one or more of, a memory freshness data, a memory quality data, an operating system instance to physical memory location relationship data, and a memory reconfiguration data.

13. The system of claim 1, where the second plurality of memory locations is located in internal memory of the memory mapping logic.

14. The system of claim 1, where the second plurality of memory locations is located in internal memory of the memory quality assurance logic.

15. The system of claim 1, where the second plurality of memory locations is physically connected to the first plurality of memory locations.

16. The system of claim 1, where the memory quality assurance logic is configured to select the second plurality of memory locations.

17. A method comprising:

selectively copying contents of a first plurality of memory locations to a second plurality of memory locations;

logically replacing the first plurality of memory locations with the second plurality of memory locations; and initiating memory testing of the first plurality of memory locations without an operating system interaction and without consumption of operating system resources, where the first plurality of memory locations is less than a page of memory and where the second plurality of memory locations is less than a page of memory.

18. The method of claim 17, where access to the contents of the first plurality of memory locations as copied to the second plurality of memory locations can continue concurrently with the memory testing.

19. The method of claim 17, where the memory testing of the first plurality of memory locations can continue without consuming a non-memory operating system resource.

20. The method of claim 17, comprising identifying the first plurality of memory locations by one or more of, a linear method, a round-robin method, a random method, a least frequently used method, a most frequently used method, a most recently exhibiting an error method, and a least recently exhibiting an error method.

21. The method of claim 17, where the first plurality of memory locations is logically replaced by the second plurality of memory locations by reconfiguring address resolving means.

22. The method of claim 17, comprising selectively logically removing the first plurality of memory locations.

23. The method of claim 17, comprising selectively logically replacing the first plurality of memory locations with a third plurality of memory locations , where the first plurality of memory locations and the third plurality of memory locations are physically located in the same memory apparatus.

24. The method of claim 17, comprising providing a report concerning a quality of the first plurality of memory locations, where the report is based, at least in part, on the testing of the first plurality of memory locations.

25. The method of claim 17, comprising storing a quality data associated with the quality of the first plurality of memory locations, where the quality data is based, at least in part, on the testing of the first plurality of memory locations.

26. The method of claim 17, where testing the first plurality of memory locations includes two or more test methods.

27. The method of claim 17, where the first plurality of memory locations can be tested by one or more of, a parity test, an electrical test, a striping test, a marching one test, a marching zero test and a pattern test.

28. The method of claim 17, comprising selecting the second plurality of memory locations to logically replace the first plurality of memory locations.

29. A system, comprising:
a processor;
a memory operably connected to the processor, where the processor can access the memory;
a memory mapping logic configured to provide access to memory locations in the memory, where the memory mapping logic can be configured to direct a memory accessing operation intended for one memory location to another memory location; and
a memory quality assurance logic operably connected to the memory mapping logic, where the memory quality assurance logic is configured to:
control copying of contents between a first plurality of memory locations and a second plurality of memory locations;
reconfigure the memory mapping logic so that memory accessing operations intended for the first plurality of memory locations are directed to the second plurality of memory locations; and
initiate memory testing of the first plurality of memory locations,
where the first plurality of memory locations is less than a page of memory and where the second plurality of memory locations is less than a page of memory,
where the memory mapping logic and the memory quality assurance logic are transparent to an operating system.

30. The system of claim 29, where the system is embedded in a computer.

31. The system of claim 29, where the system is embedded in an image forming device.

32. The system of claim 29, where the memory quality assurance logic includes one or more data stores configured to store one or more of, a memory freshness data, a memory quality data, an operating system instance to physical memory location relationship data, and a memory reconfiguration data.

33. The system of claim 29, where the memory quality assurance logic is operably connected to one or more data stores configured to store one or more of, a memory freshness data, a memory quality data, an operating system instance to physical memory location relationship data, and a memory reconfiguration data.

34. The system of claim 29, comprising a memory location selection logic configured to select the first plurality of memory locations and the second plurality of memory locations.

35. A computer-readable medium physically storing processor executable instructions operable to perform a method, the method comprising:
selecting a first memory location to test from a first set of memory;
selectively copying contents of the first memory location to a second memory location of a second set of memory;
logically replacing the first memory location with the second memory location; and initiating testing of the first memory location without consuming operating system resources,
where the first set of memory is less than a page of memory and where the second set of memory is less than a page of memory.

36. The computer-readable medium of claim 35, where the method comprises logically replacing the first memory location with the second memory location by reconfiguring address resolving means.

37. A system comprising:
means for logically replacing a testable memory location with a replacement memory location, where the means for logically replacing operates without interacting with an operating system;
means for testing the testable memory location, where the means for testing operates without interacting with an operating system; and
means for selectively logically removing the testable memory location from a set of memory based, at least in part, on a result of testing the testable memory location, where the means for selectively logically removing the testable memory location operates without interacting with an operating system,
where the set of memory is less than a page of memory,
where the means for logically replacing a testable memory location, the means for testing the testable memory location and the means for selectively logically removing the testable memory location do not consume operating system resources.

38. An operating system transparent system for on-the-fly memory testing, comprising:
a memory location identifying logic configured to identify a plurality of target memory locations and a plurality of replacement memory locations;
a programmable memory address resolving logic configured to provide access to the plurality of target memory locations and the plurality of replacement locations; and
a test controlling logic operably connected to the programmable memory address resolving logic, the test controlling logic configured to selectively program the programmable memory address resolving logic to divert memory accesses from the plurality of target memory locations to the plurality of replacement memory locations and to initiate testing of the plurality of target memory locations,
where the memory location identifying logic, the programmable memory address resolving logic, and the test controlling logic do not consume operating system resources,
where the plurality of target memory locations is less than a page of memory and where the plurality of replacement memory locations is less than a page of memory.

39. The system of claim 38, where the memory location identifying logic is configured to identify the plurality of target memory locations using one or more of, a linear method, a round-robin method, a random method, a least frequently used method, a most frequently used method, a most recently exhibiting an error method, and a least recently exhibiting an error method.

40. The system of claim 38, where the programmable memory address resolving logic includes a crossbar.

41. The system of claim 38, where the test controlling logic is also configured to selectively reprogram the programmable memory address resolving logic to stop diverting memory accesses from the plurality of target memory locations to the plurality of replacement memory locations.

42. The system of claim 38, where the test controlling logic is also configured to logically remove the plurality of target memory locations from a pool of memory available to operating system instances without requiring an operating system instance to halt execution.

43. The system of claim 42, where the test controlling logic logically removes the plurality of target memory locations from the pool of memory by reprogramming the programmable memory address resolving logic.

44. An operating system transparent method for on-the-fly memory testing, comprising:

identifying a plurality of test memory locations and a plurality of mirroring memory locations;

mirroring the test memory locations to the mirroring memory locations;

selectively reconfiguring memory accessing operations so that memory accesses originating in an operating system instance that are addressed to the plurality of test memory locations are redirected to the plurality of mirroring memory locations; and testing the plurality of test memory locations without disrupting an operating system instance, where the plurality of test memory locations is less than a page of memory and where the plurality of mirroring memory locations is less than a page of memory, where the method is performed without consumption of operating system resources.

* * * * *

UNITED STATES PATENT AND TRADEMARK OFFICE
CERTIFICATE OF CORRECTION

| | |
|---|---|
| PATENT NO. | : 7,346,755 B2 |
| APPLICATION NO. | : 10/663128 |
| DATED | : March 18, 2008 |
| INVENTOR(S) | : Ken Gary Pomaranski et al. |

It is certified that error appears in the above-identified patent and that said Letters Patent is hereby corrected as shown below:

On the face page, in field (57), under "Abstract", lines 1-15, delete "An example memory quality assuring system is provided. The system may include a memory mapping logic configured to facilitate accessing memory locations and redirecting memory accessing operations. The system may also include a memory quality assurance logic configured to logically replace a first memory location with a second memory location, to initiate testing logically isolated memory locations, and to selectively logically remove tested memory locations based on the testing.

It is emphasized that this abstract is provided to comply with the rules requiring an abstract that will allow a searcher or other reader to quickly ascertain the subject matter of the application. It is submitted with the understanding that it will not be employed to interpret or limit the scope or meaning of the claims 37 CFR 1.72(b)." and insert -- Methodology, systems, and media associated with memory quality assurance are described. One exemplary method embodiment comprises selectively copying the contents of a first memory location to a second memory location, logically replacing the first memory location with the second memory location and initiating memory testing of the first memory location without an operating system interaction. --, therefor. (Preliminary Amendment to abstract filed on Oct. 02, 2003, page 1, lines 11-15)

In column 16, line 56, delete "A. Gamer, A Dictionary of Modem" and insert -- A. Garner, A Dictionary of Modern --, therefor.

In column 17, line 29, in Claim 5, delete "first memory" and insert -- memory --, therefor.

UNITED STATES PATENT AND TRADEMARK OFFICE
CERTIFICATE OF CORRECTION

PATENT NO. : 7,346,755 B2
APPLICATION NO. : 10/663128
DATED : March 18, 2008
INVENTOR(S) : Ken Gary Pomaranski et al.

It is certified that error appears in the above-identified patent and that said Letters Patent is hereby corrected as shown below:

In column 17, line 43, in Claim 7, delete "pad," and insert -- part, --, therefor.

In column 17, line 53, in Claim 9, delete "loge," and insert -- logic, --, therefor.

In column 18, line 67, in Claim 27, after "zero test" insert -- , --.

In column 19, line 28, in Claim 29, after "of memory" delete "." and insert -- , --, therefor.

Signed and Sealed this

Seventeenth Day of November, 2009

David J. Kappos
*Director of the United States Patent and Trademark Office*